(12) United States Patent
Bijvoet et al.

(10) Patent No.: US 7,525,636 B2
(45) Date of Patent: Apr. 28, 2009

(54) LITHOGRAPHIC APPARATUS AND EXPOSURE METHOD

(75) Inventors: Dirk-Jan Bijvoet, Eindhoven (NL); Anton Adriaan Bijnagte, Tricht (NL)

(73) Assignee: ASML Netherlands B.V., Veldhoven (NL)

( * ) Notice: Subject to any disclaimer, the term of this patent is extended or adjusted under 35 U.S.C. 154(b) by 47 days.

(21) Appl. No.: 11/898,802

(22) Filed: Sep. 14, 2007

(65) Prior Publication Data

US 2009/0073402 A1    Mar. 19, 2009

(51) Int. Cl.
G03B 27/42    (2006.01)
G03B 27/62    (2006.01)
G03B 27/58    (2006.01)

(52) U.S. Cl. .............................. 355/53; 355/75; 355/72

(58) Field of Classification Search ............ 355/53, 355/55, 72–76
See application file for complete search history.

(56) References Cited

U.S. PATENT DOCUMENTS 6,888,621 B2 *   5/2005   Araki et al. ................... 355/75

* cited by examiner

*Primary Examiner*—Hung Henry Nguyen
(74) *Attorney, Agent, or Firm*—Pillsbury Winthrop Shaw Pittman LLP (57) ABSTRACT

A lithographic apparatus includes a control unit arranged to perform a first position measurement of the patterning device, apply an asymmetric acceleration profile to the support supporting the patterning device, perform a second position measurement of the patterning device, determine a slip characteristic of the pattering device based on the two position measurements and the applied acceleration profile, and perform a scanning exposure of a substrate taking into account the slip characteristic of the patterning device.

13 Claims, 4 Drawing Sheets

LITHOGRAPHIC APPARATUS AND EXPOSURE METHOD

BACKGROUND

1. Field of the Invention

The present invention relates to a lithographic apparatus, a method for calibrating a position of an object relative to a frame and a method of exposing a substrate using a lithographic apparatus.

2. Description of the Related Art

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In a scanning type lithographic apparatus, a mask (or patterning device) is carried by a support, also referred to as a mask table. While generating a pattern on a target portion of a substrate, the mask table performs scanning movements along a line of movement, in a single scan direction or scanning in both (i.e. opposite) directions along the line of movement. When a reversal of direction takes place, the mask table is decelerated and accelerated between the successive scanning movements. Also, the mask table is accelerated and decelerated before and after each scanning movement in a specific direction. Conventionally, the scanning movements are made with constant velocity. However, the scanning movements may also at least partly be made with varying velocity, e.g. the movements including at least part of the deceleration and/or acceleration phases.

The mask table supports or holds the mask. It holds the mask in a manner that depends on the orientation of the mask, the design of the lithographic apparatus, and other conditions, such as for example whether or not the mask is held in a vacuum environment. The mask table may include a frame or a table, for example, which may be fixed or movable as required. The mask table (and its control system) may ensure that the mask is at a desired position, for example with respect to the projection system.

The mask is coupled to the mask table through a clamp. Conventionally, the mask is coupled to the mask table through a vacuum clamp which may be implemented as one or more vacuum pads provided on the mask table, where at least a part of a circumferential area of the mask is held onto the vacuum pads. By the clamp, a normal force between adjacent surfaces of the mask and the mask table is generated, resulting in a friction between contacting surfaces of the mask and the mask table. The vacuum pads include one or more openings coupled to a gas discharge and supply system. Instead of a vacuum coupling between the mask and the mask table, other forms of couplings based on friction between the mask and the mask table are conceivable, such as electrostatic or mechanical clamping techniques to hold the mask against the mask table. During the exposure of the substrate, the mask and the substrate need to be synchronized in order to expose the pattern that is on the mask onto the correct position on the substrate. If a pattern is not projected on the appropriate position, a mismatch could occur with a further pattern that is projected onto the substrate. Such a so-called overlay-error could hinder the proper operation of the semiconductor device that is made.

In an ongoing development, increasing throughput requirements placed on lithographic apparatus lead to increasing scanning velocities. Consequently, deceleration and acceleration of the mask table increase. In the deceleration and acceleration phases, increased inertia forces act on the mask table and on the mask. These inertia forces may cause the mask or pattern device to displace relative to the mask table or support (i.e. the mask may slip relative to the mask table). In a lithographic apparatus, the synchronization between the mask and the substrate is controlled by a control unit that controls the stages to which the mask table and substrate table are mounted. This control is usually based on the position measurement of the mask table and the substrate table, not on an actual position measurement of the mask and the substrate. In such an arrangement, a displacement of the mask relative to mask table, is not detected or taken into account, resulting in the aforementioned mismatch.

When acceleration or deceleration of the mask is comparatively low, the occurring slip remains within acceptable limits and can be ignored. With increasing deceleration and acceleration levels, the slip occurring between the mask and the mask table increases and the reproducibility worsens resulting in an unacceptable mismatch between the actual position of a projected pattern and the required position.

In addition, the reticle or mask slip variation over a population of reticles or masks, which is relevant for overlay, may become considerable.

It can further be noted that the allowable mismatch between consecutive layers in a semiconductor device tends to decrease due to a decrease in the size of the pattern features.

Therefore, slip of the mask or patterning device becomes less tolerable, as such a slip may result in a position error of the pattern projected onto the substrate.

SUMMARY

It is desirable to provide means for taking a slip characteristic of a patterning device in a lithographic apparatus into account.

According to an embodiment of the invention, there is provided a lithographic apparatus including an illumination system configured to condition a radiation beam; a support constructed to support a patterning device, the patterning device being capable of imparting the radiation beam with a pattern in its cross-section to form a patterned radiation beam; a substrate table constructed to hold a substrate; a projection system configured to project the patterned radiation beam onto a target portion of the substrate, and a measurement system configured to measure a position of the patterning device. The lithographic apparatus further includes a first stage apparatus configured to displace the support, a second stage apparatus configured to support the substrate table, and a control unit arranged to perform a first position measurement of the patterning device using the measurement system, apply an asymmetric acceleration profile to the support using the first stage apparatus, perform a second position measurement of the patterning device using the measurement system, determine a slip characteristic of the patterning device based on the two position measurements and the applied acceleration profile, and perform a scanning exposure of a substrate by controlling the first and second stage apparatus taking into account the slip characteristic of the patterning device. The control unit may perform these procedures consecutively.

In an other embodiment of the invention, there is provided a method for calibrating a position of an object mounted to a frame of an apparatus, the method including clamping an object to the frame, performing a first position measurement of the object, applying an asymmetric acceleration profile to the frame, performing a second position measurement of the object, determining a slip characteristic of the object as a function of the applied acceleration profile based on the two position measurements, and supplying the slip characteristic to a control unit of the apparatus.

According to a further embodiment of the invention, there is provided a method of exposing a substrate using a lithographic apparatus, the method including loading a patterning device, clamping the patterning device to a support, performing a first position measurement of the patterning device relative to the support, applying an asymmetric acceleration profile to the support, performing a second position measurement of the patterning device relative to the support, determining a slip characteristic of the patterning device based on the two position measurements and the applied acceleration profile, supplying the slip characteristic to a control unit of the lithographic apparatus, and performing an exposure of the substrate using the control unit taking into account the slip characteristic of the patterning device.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
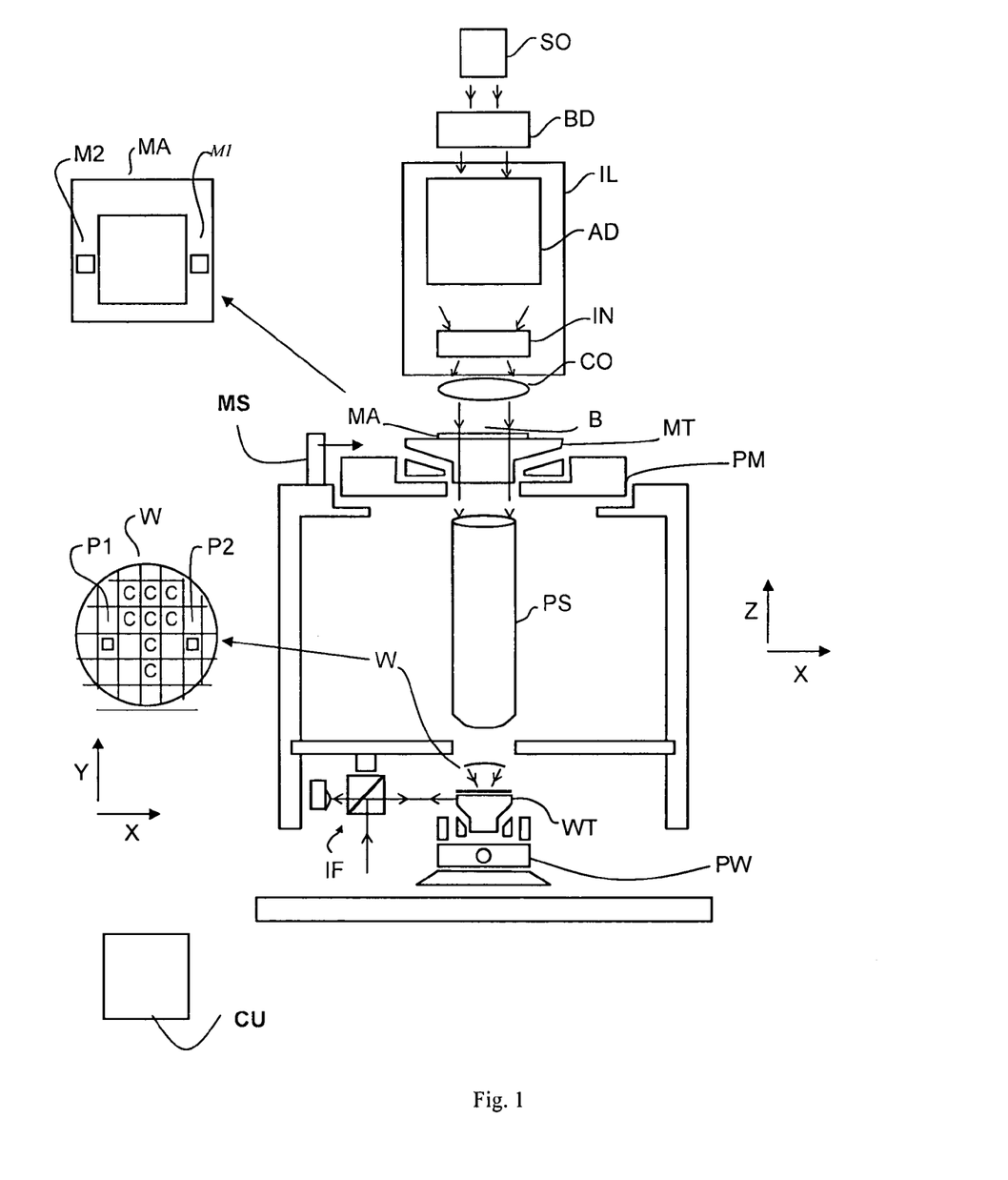
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a pattern support structure or pattern support (e.g. a mask table) MT constructed to support or hold a patterning device (e.g. a mask) MA and connected to a first positioning device PM configured to accurately position the patterning device in accordance with certain parameters. The apparatus also includes a substrate table or substrate support (e.g. a wafer table) WT constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The pattern support structure holds the patterning device in a manner that depends on the orientation of the patterning device, the design of the lithographic apparatus, and other conditions, such as for example whether or not the patterning device is held in a vacuum environment. The pattern support structure can use mechanical, vacuum, electrostatic or other clamping techniques to hold the patterning device. The pattern support structure may be a frame or a table, for example, which may be fixed or movable as required. The pattern support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g. mask) MA, which is held on the pattern support structure (e.g. mask table) MT, and is patterned by the patterning device. Having traversed the patterning device (e.g. mask) MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the patterning device (e.g. mask) MA with respect to the path of the radiation beam B, e.g. after mechanical retrieval from a mask library, or during a scan. In general, movement of the pattern support structure (e.g. mask table) MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the pattern support structure (e.g. mask table) MT may be connected to a short-stroke actuator only, or may be fixed. Patterning device (e.g. mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g. mask) MA, the mask alignment marks may be located between the dies.

The depicted apparatus could be used in at least one of the following modes:

1. In step mode, the pattern support structure (e.g. mask table) MT or "mask support" and the substrate table WT or "substrate support" are kept essentially stationary, while an entire pattern imparted to the radiation beam is projected onto a target portion C at one time (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the pattern support structure (e.g. mask table) MT or "mask support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the pattern support structure (e.g. mask table) MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the pattern support structure (e.g. mask table) MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

The lithographic apparatus as shown in FIG. 1 further includes a measurement system MS configured to measure a position of the patterning device MA and a control unit CU arranged to perform the following procedures: performing a first position measurement of the patterning device MA using the measurement system MS, applying an asymmetric acceleration profile to the support using the positioning device PM, performing a second position measurement of the patterning device MA using the measurement system MS, determining a slip characteristic of the patterning device MA based on the two position measurements and the applied acceleration profile, performing a scanning exposure of a substrate by controlling the first positioning device PM and the second positioning device PW taking into account the slip characteristic of the patterning device MA. These procedures may be performed consecutively. In an embodiment, the control unit CU is configured to control the measurement system MS to perform a first and second position measurements of the patterning device MA. The control unit CU may also be configured to control the positioning device PM to apply an asymmetric acceleration profile to the support, to determine a slip characteristic of the patterning device MA based on the two position measurements and the applied acceleration profile, and to control the first positioning device PM and the second positioning device PW taking into account the slip characteristic of the patterning device MA to perform a scanning exposure of a substrate.

FIGS. 2 to 6 describe in further detail some embodiments of the present invention.

An embodiment of the present invention describes an improved lithographic apparatus that enables an improved positioning of a patterning device relative to a substrate during exposure. To accurately project a pattern (provided by a patterning device such as a mask) onto a substrate the relative position between the patterning device and the substrate should preferably be known within a few nm. In order to achieve this, the control unit CU of the lithographic apparatus is arranged to perform the procedures as described above. These procedures include a position measurement of a patterning device mounted to a support.

Figure 2:
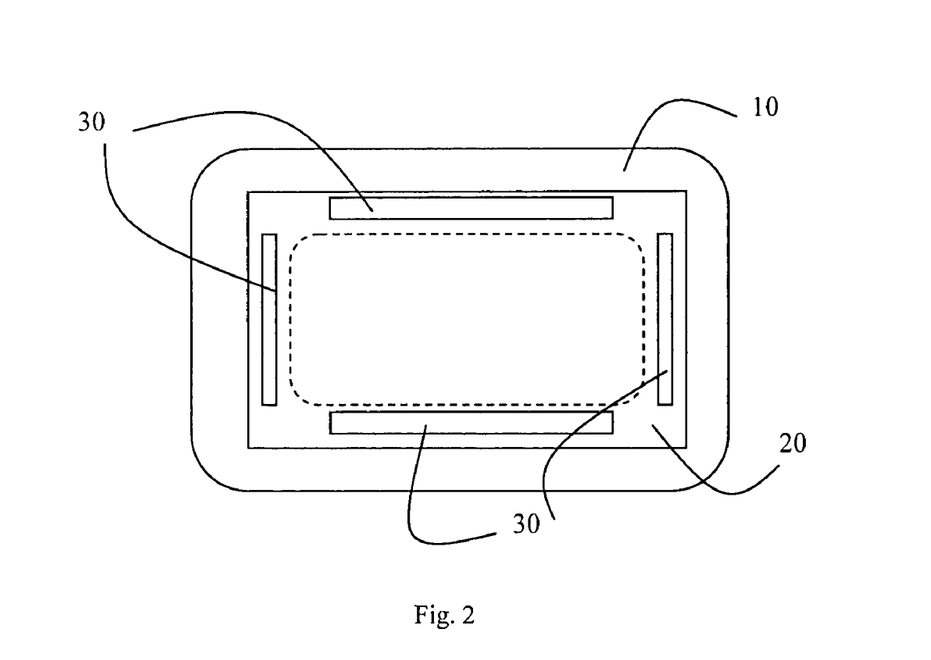
FIG. 2 depicts a schematic view of a pattern support (e.g. mask table) provided with a patterning device.
Figure 3:
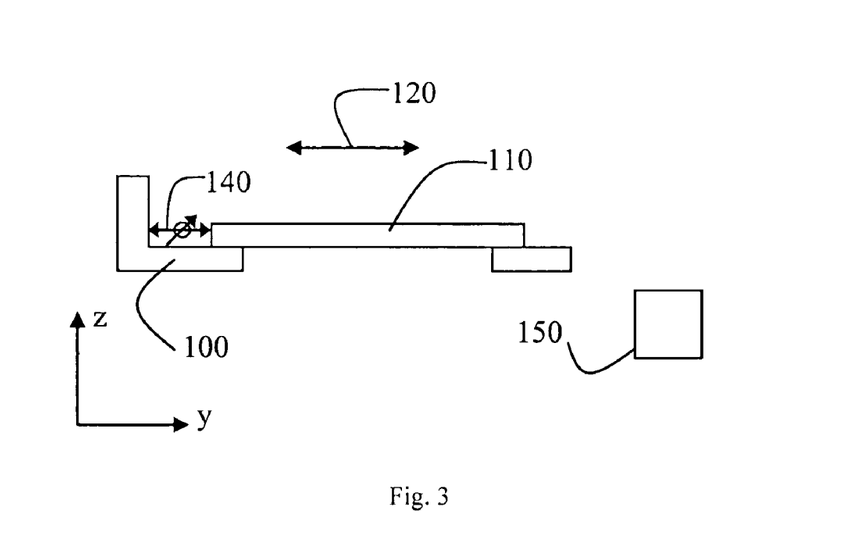
FIG. 3 schematically depicts a YZ-view of a pattern support (e.g. mask table) that can be applied in a lithographic apparatus according to an embodiment of the invention.

In general, the patterning device is an object that is loaded into the lithographic apparatus and clamped to a support, e.g. a mask table. FIG. 2 schematically depicts a top view of such a pattern support structure (e.g. mask table) 10 (or support) configured to hold a patterning device (e.g. mask) 20. FIG. 2 also shows several vacuum pads 30 enabling the patterning device (e.g. mask) to be clamped to the pattern support structure (e.g. mask table). It is to be noted that alternative systems or devices to clamp the patterning device 20 may equally be applied (e.g. electrostatic or mechanical clamping). In an embodiment of the present invention, the first and second position measurements include a position measurement of the patterning device relative to the support 10. To enable this, a support as shown in FIG. 3 may be applied. FIG. 3 schematically depicts a cross-sectional view of a support 100 and a patterning device 110 mounted to the support. In operation, the support 100 may be moved in a scanning direction indicated by arrow 120. Rather than being mounted on top of the support 100, the patterning device 110 may equally be mounted or clamped to the bottom of the support, as e.g. done with reflective patterning devices.

FIG. 3 further schematically depicts a measurement system 140 arranged to measure the relative position between the support 100 and the patterning device (e.g. mask) 110. As will be appreciated, various possibilities exist for measuring the position of the pattering device relative to the support. Examples of such measurement systems are interferometers, grating based encoder measurement systems, capacitance sensors, etc.

It can be noted that, in an embodiment of the present invention, it is sufficient that the measurement system 140 enables to measure a change in relative position between the patterning device and the support, rather than providing information on the absolute position between the patterning device and the support.

FIG. 3 further depicts a control unit 150 configured to control the movement of the support 100 by a stage apparatus (not shown). The control unit 150 enables, by controlling the stage apparatus, the pattern support structure (e.g. mask table) to follow a predefined trajectory or allows the pattern support structure (e.g. mask table) to be submitted to certain acceleration profile. This can e.g. be done by supplying the controller with a set-point to be followed. Alternatively, the set-point to be followed by the support can also be generated by the controller. The measurement system 140 can e.g. enable the position of the patterning device (e.g. mask) (or the change in position of the mask) to be determined before and after the pattern support structure (e.g. mask table) has been submitted to a certain acceleration profile. Based on the applied acceleration profile and both position measurements, the control unit can determine a slip characteristic of the patterning device (e.g. mask).

In an embodiment of the present invention, the control unit is further arranged to adjust a set-point of the support or the patterning device based on the slip characteristic of the patterning device. In this way, the slip characteristic can be used to provide a more accurate positioning of the mask relative to the substrate thereby enabling a more accurate projection of the patterning device pattern onto the substrate.

In order to determine the slip characteristic based on the two position measurements (before and after the application of the acceleration profile), it is desirable to apply an asymmetric acceleration profile, i.e. a profile which includes an acceleration phase and a deceleration (or negative acceleration) phase while moving in the same direction, wherein both phases have a different absolute value for the acceleration. Therefore, in an embodiment of the present invention, the asymmetric acceleration profile includes a first acceleration phase at a first acceleration level and a second deceleration phase at a second acceleration level, different from the first acceleration level.

Figure 4:
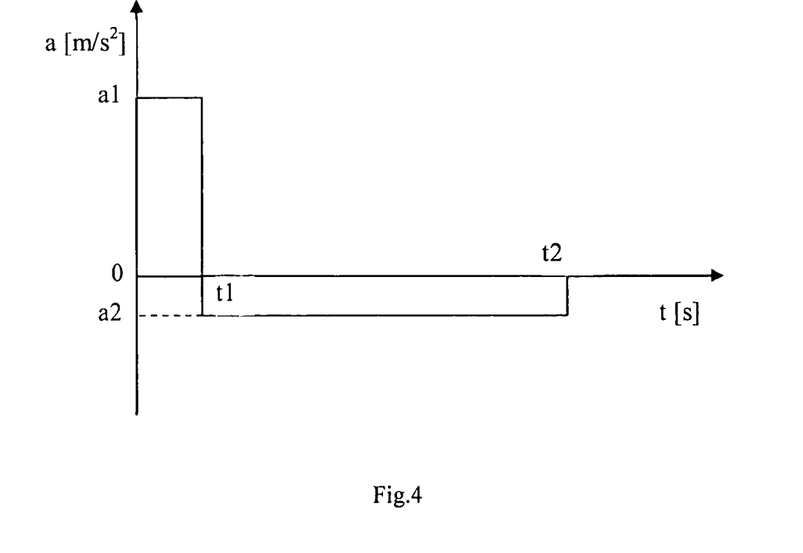
FIG. 4 depicts a schematic view of an asymmetric acceleration profile that can be used in an embodiment of the present invention.

FIG. 4 schematically depicts such an asymmetric acceleration profile. The acceleration profile consists of a first phase (from t=0 to t=t1) having an acceleration a1, followed by a second phase (from t=t1 to t=t2) having a negative acceleration (deceleration) a2 which is substantially smaller than a1 (in absolute value). It can be noted that the acceleration profile may also include a phase at constant velocity (i.e. at an acceleration=0) between the first phase and the second phase (not shown). This may be beneficial in case the first position measurement and the second position measurement are performed at different positions of the pattern support structure (e.g. mask table) (e.g. by using the measurement setup as described in FIG. 5).

Assuming that both position measurements are performed when the pattern support structure (e.g. mask table) is at standstill, it will be appreciated that the deceleration phase will be substantially longer than the acceleration phase due to the smaller level of deceleration, compared to the level of acceleration. To ensure that the pattern support structure (e.g. mask table) is at standstill when both position measurements are performed (which is preferred but not a requirement for this embodiment of the present invention), the asymmetric acceleration profile in an embodiment of the present invention is such that the integral over time of the acceleration profile is substantially equal to zero.

When the acceleration profile as depicted is applied to the pattern support structure (e.g. mask table) (e.g. by controlling the stage apparatus onto which the pattern support structure (e.g. mask table) is mounted), the patterning device (e.g. mask) slips relative to the pattern support structure (e.g. mask table) during the acceleration phase (from t=0 to t=t1) at acceleration level a1. As the deceleration a2 is substantially lower than the acceleration, the deceleration of the pattern support structure (e.g. mask table) may not result in a slippage of the patterning device (e.g. mask) relative to the pattern support structure (e.g. mask table). This is due to the fact that the slip versus acceleration characteristic has a non-linear nature. If this were not the case, i.e. in case the slip would be proportional to the acceleration, the slip occurring during the acceleration phase could partly or entirely be compensated by the slip occurring during the deceleration phase. Experiments have shown that the characteristic is in fact non-linear and that by appropriately selecting the acceleration and deceleration levels, one can determine the slip characteristic versus the acceleration based on the two position measurement performed before and after the asymmetric acceleration profile is applied. It will be appreciated that the same result may be obtained when the asymmetric acceleration profile commences with an acceleration phase with a comparatively small acceleration (sufficiently small to substantially avoid any slip to take place), followed by a deceleration phase with a comparatively high deceleration (i.e. negative acceleration) that enables the patterning device (or mask) to slip.

As an alternative to the use of a measurement unit that measures the relative position of the patterning device (e.g. mask) and the pattern support structure (e.g. mask table) directly, a position measurement unit as described below may also be applied.

In order to determine a change in the relative position of the patterning device (e.g. mask) and the pattern support structure (e.g. mask table) one may use a sensor that is configured to detect the aerial image of a mark (also referred to as a marker or pattern) on the patterning device (e.g. mask) combined with a position measurement of the pattern support stage (e.g. mask stage). Therefore, in an embodiment of the present invention, the first position measurement includes a position measurement of an aerial image of a first pattern on the patterning device and the second position measurement includes a position measurement of an aerial image of either the first pattern on the patterning device or a second pattern present on the patterning device.

Figure 5:
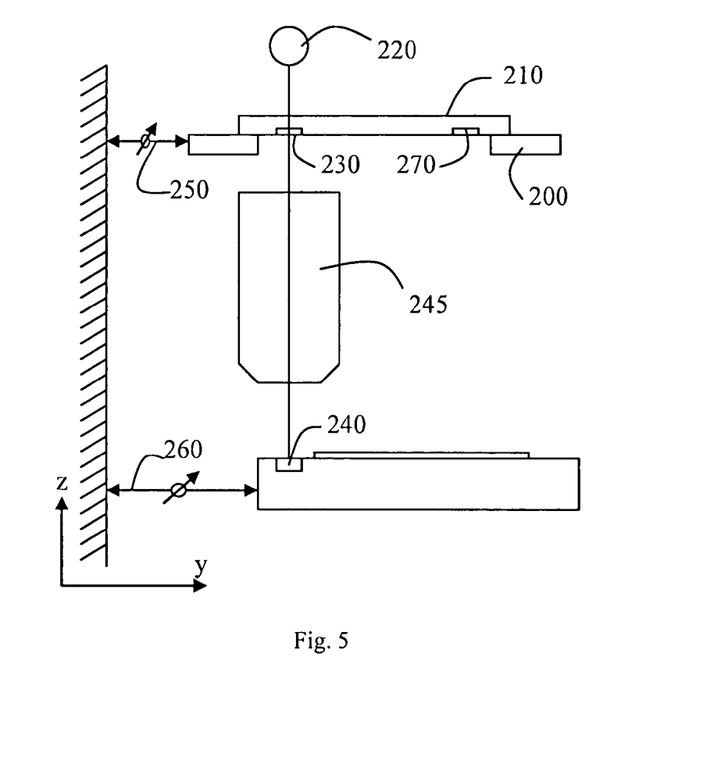
FIG. 5 schematically depicts a measurement setup of a lithographic apparatus according to an embodiment of the invention.

In general, as also mentioned above, a lithographic apparatus includes a measurement system that is configured to measure the position of both the pattern support structure (e.g. mask table) (or support) and the substrate (or wafer) table. This measurement system, e.g. an interferometer or encoder based measurement system, allows the position of the tables to be determined with a nm accuracy. When a substrate and patterning device (e.g. mask) are loaded onto, respectively, the substrate and pattern support structure (e.g. mask table), knowing the position of the tables may not be sufficient to ensure that the pattern on the patterning device (e.g. mask) is projected on the appropriate position on the substrate. This is due to the fact that when a patterning device or a substrate is loaded (and clamped), its position relative to the table is unknown; or at least not known within the desired accuracy (~nm). In order to determine where the pattern on the patterning device (e.g. mask) is projected, a setup as shown in FIG. 5 may be applied. FIG. 5 schematically depicts a pattern support structure (e.g. mask table) 200 configured to hold patterning device (e.g. a mask) 210. A radiation source 220 is used to project an image of a mark 230 towards a sensor on the substrate table 240 (via a projection system 245). The sensor detects the position of the aerial image of the mark 230. Combined with the position measurements of the pattern support structure (e.g. mask table) and substrate table (schematically depicted by the arrows 250 and 260 respectively), the position of the patterning device (e.g. mask) with respect to the sensor on the substrate table may be derived. FIG. 5 also depicts a second mark 270 located on the patterning device (e.g. mask) 210, the markers 270 and 230 being spaced apart over a distance d in the Y-direction.

In order to determine the slip characteristic of the patterning device (e.g. mask) due to a certain acceleration, it is sufficient to determine the position of the patterning device (e.g. mask) with respect to the sensor before and after the application of an asymmetric acceleration profile to the pattern support structure (e.g. mask table). Note that when an acceleration profile according to FIG. 3 is applied, the relative position of the pattern support structure (e.g. mask table) with respect to the projection system and light source has changed, i.e. the pattern support structure (e.g. mask table) has traveled over a certain distance. Rather than returning to the position as indicated in FIG. 5, the second position measurement can e.g. be performed using the second mark 270 on the mask 210. In general, a patterning device (e.g. mask) is provided with several marks along the scanning direction. It will be appreciated that in case the second position measurement is performed using a different mark or pattern, the distance d (see FIG. 5) between both marks needs to be taken into account as well, in order to determine the slip of the patterning device (e.g. mask). In a preferred embodiment, the distance traveled by the support when the asymmetric acceleration profile is performed substantially equals the distance between the first pattern and the second pattern. By doing so, substantially no additional displacements (which would take time) are needed between the performance of the acceleration profile and the second position measurement.

As an alternative to performing the position measurements using different marks on the patterning device (e.g. mask), one may apply a different asymmetric acceleration profile such that, when the acceleration profile has been executed, the patterning device (e.g. mask table) is substantially in the same position and the same mark or pattern can be used for both position measurements. Therefore, in an embodiment of the present invention, the asymmetric acceleration profile is such that the position of the support relative to a frame of the apparatus before and after the application of the asymmetric acceleration profile is substantially the same. In this case, the first pattern present on the patterning device may be applied to perform the second position measurement.

Figure 6:
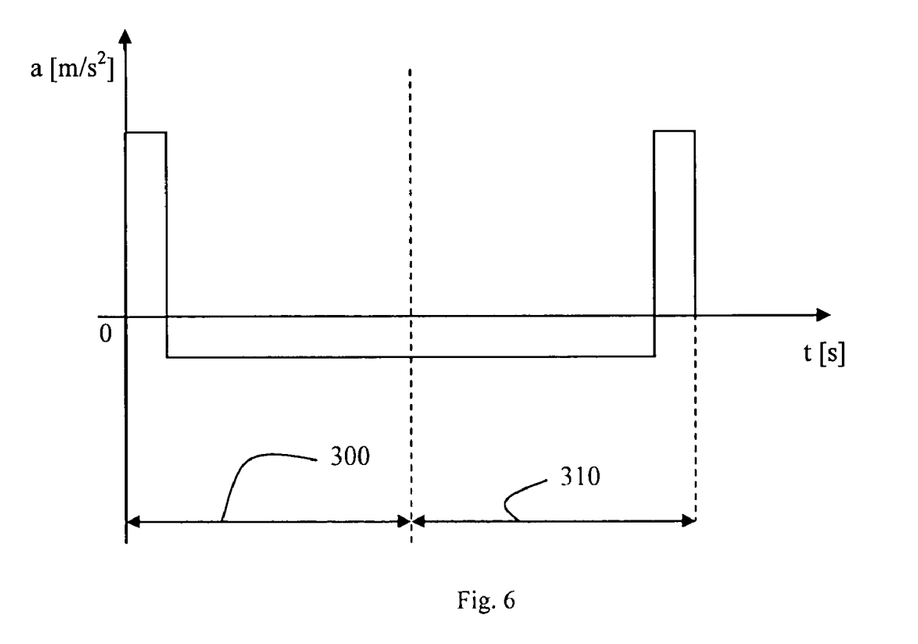
FIG. 6 depicts a schematic view of a further asymmetric acceleration profile that can be used in an embodiment of the present invention.

FIG. 6 schematically discloses an acceleration profile that may be used for this purpose. The acceleration profile includes a first asymmetric acceleration phase 300 (after which the pattern support stage (e.g. mask stage) is at stand still) followed by a second asymmetric acceleration phase 310 in the opposite direction. Note that, since the second phase describes a displacement in opposite direction, the acceleration part of the second phase has a negative acceleration while the deceleration part has a positive acceleration in the graph of FIG. 6. Note also that, in order to ensure that the slip occurring in the second phase does not, entirely or partly, compensate the slip occurring in the first phase, the acceleration is performed at a substantially lower acceleration value than the deceleration. In the embodiment of FIG. 6, the asymmetric acceleration profile of the second phase may be considered the mirror image of the profile of the first phase, thereby ensuring that the slip occurring in the first phase (during the acceleration part of the first phase) occurs in the same direction as the slip occurring in the second phase (during the deceleration part of the second phase)

In contrast to the embodiment described in FIG. 3, the embodiment of FIG. 5 does not use an additional measurement system that enables the relative position of the patterning device (e.g. mask) and the pattern support structure (e.g. mask table) to be determined, nor does it use amendments to a conventional patterning device (e.g. mask) as the markers that are used to perform the position measurements are already provided on a conventional patterning device (e.g. mask).

When the slip characteristic has been determined, the control unit of the lithographic apparatus may take appropriate actions to compensate for the slip by e.g. taking the characteristic into account in the set-point to be followed by the pattern support structure (e.g. mask table). Alternatively, the set-point followed by the substrate table can be altered taking the expected slip of the patterning device into account. Therefore, in an embodiment of the present invention, the control unit is arranged to adjust a set-point of the support or the patterning device based on the slip characteristic of the patterning device.

In a preferred embodiment, the asymmetric acceleration profile is such that the acceleration level which causes the patterning device (e.g. mask) to slip, is selected to substantially correspond to the acceleration applied when the lithographic apparatus is operated to expose the mask pattern onto the substrate. In theory, one could determine the slip characteristic at a different acceleration level and estimate the slip occurring at the actual acceleration (that is applied during the exposure process) based on this characteristic; but, due to the non-linearity of the characteristic, this may be cumbersome and may result in a less accurate correction of the slip.

In a preferred embodiment, an alternating force is applied to the pattern support structure (e.g. mask table) after clamping the patterning device (e.g. mask) and prior to performing the first position measurement. Experiments by the inventors have shown that by doing so, the repeatability of the slip characteristic may be significantly improved. As a result, the correction of the slip during the exposure process may equally be improved. Applying such an alternating force to the pattern support structure (e.g. mask table) (also referred to as shaking the mask table) ensures that the slip characteristic goes into a steady state stage. Experiments have shown that when the determination of the slip characteristic of a patterning device (e.g. mask) is repeated several times after loading the patterning device (e.g. mask) onto the pattern support structure (e.g. mask table), the characteristic obtained may vary substantially. Several factors or conditions may be involved that cause the slip characteristic to vary. As an example, the contamination of the patterning device (e.g. mask) or the pattern support structure (e.g. mask table) may be involved. Also, mechanical stresses that have built up during the loading of the patterning device (e.g. mask) may be involved. By shaking the patterning device (e.g. reticle or mask) however, the effects of such conditions may be mitigated or removed. As a consequence, after shaking the patterning device (e.g. reticle or mask), the slip characteristic may become more predictable. Experiments show that by shaking the patterning device (e.g. reticle or mask) by approximately 50 times (preferable at the same acceleration level as later on applied during the scanning exposure process), the patterning device (e.g. reticle or mask) slip may become more predictable. Note that for shaking the patterning device (e.g. reticle or mask), no asymmetric acceleration profile is needed. The shaking can be represented by a plurality of cycles, each including an acceleration phase followed by a deceleration, wherein the absolute value of the acceleration level can be the same as the absolute value of the deceleration level.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention for addressing the slip characteristic of the patterning device of a lithographic apparatus, it will be clear that the same considerations and solutions can be applied to address slippage of a substrate relative to a substrate table; in the current lithographic apparatuses, the reticle or patterning device is subject to higher accelerations than the substrate due to the ¼ magnification that is currently used. In case future lithographic apparatuses would apply other magnifications (e.g. ⅟₁ magnification) or in case acceleration levels or the required accuracy levels would become even higher, it may become necessary to perform a slip calibration on substrate level as well.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A lithographic apparatus comprising:
   an illumination system configured to condition a radiation beam;
   a support constructed to hold a patterning device, the patterning device being capable of imparting the radiation beam with a pattern in its cross-section to form a patterned radiation beam;
   a substrate table constructed to hold a substrate;
   a projection system configured to project the patterned radiation beam onto a target portion of the substrate;
   a measurement system configured to measure a position of the patterning device;
   a first stage apparatus configured to displace the support;
   a second stage apparatus configured to support the substrate table; and
   a control unit constructed and arranged to:
      perform a first position measurement of the patterning device using the measurement system;
      apply an asymmetric acceleration profile to the support using the first stage apparatus;
      perform a second position measurement of the patterning device using the measurement system;

determine a slip characteristic of the patterning device based on the two position measurements and the applied acceleration profile; and perform a scanning exposure of a substrate by controlling the first and second stage apparatus taking into account the slip characteristic of the patterning device.

2. A lithographic apparatus according to claim 1, wherein the control unit is configured to perform the first position measurement, apply the asymmetric acceleration profile, to perform the second position measurement, to determine the slip characteristic and to perform a scanning exposure consecutively.

3. A lithographic apparatus according to claim 1, wherein the control unit is further constructed and arranged to control the first stage apparatus to apply an alternating force to the support prior to the first position measurement of the patterning device.

4. A lithographic apparatus according to claim 1, wherein the first and second position measurements comprise a position measurement of the patterning device relative to the support.

5. A lithographic apparatus according to claim 1, wherein the first position measurement comprise a position measurement of an aerial image of a first pattern on the patterning device and wherein the second position measurement comprises a position measurement of an aerial image of either the first pattern on the patterning device or a second pattern present on the patterning device.

6. A lithographic apparatus according to claim 1, wherein the asymmetric acceleration profile comprises a first acceleration phase at a first acceleration level and a second deceleration phase at a second acceleration level, the second acceleration level different from the first acceleration level.

7. A lithographic apparatus according to claim 6, wherein the asymmetric acceleration profile is such that the integral over time of the acceleration profile is substantially equal to zero.

8. A lithographic apparatus according to claim 6, wherein the asymmetric acceleration profile is such that the position of the support relative to a frame of the apparatus before and after the application of the asymmetric acceleration profile is substantially the same.

9. A lithographic apparatus according to claim 5, wherein a distance traveled by the support when the asymmetric acceleration profile is performed substantially equals a distance between the first pattern and the second pattern.

10. A lithographic apparatus according to claim 1, wherein the control unit is further arranged to adjust a setpoint of the support or the patterning device based on the slip characteristic of the patterning device.

11. A method for calibrating a position of an object mounted to a frame of an apparatus, the method comprising:
  clamping an object to the frame;
  performing a first position measurement of the object;
  applying an asymmetric acceleration profile to the frame;
  performing a second position measurement of the object;
  determining a slip characteristic of the object as a function of the applied acceleration profile based on the two position measurements; and
  supplying the slip characteristic to a control unit of the apparatus.

12. A method according to claim 11, comprising applying an alternating force to the frame after clamping the object and prior to performing the first position measurement.

13. A method of exposing a substrate using a lithographic apparatus comprising:
  loading a patterning device;
  clamping the patterning device to a support;
  performing a first position measurement of the patterning device relative to the support;
  applying an asymmetric acceleration profile to the support;
  performing a second position measurement of the patterning device relative to the support;
  determining a slip characteristic of the patterning device based on the two position measurements and the applied acceleration profile;
  supplying the slip characteristic to a control unit of the lithographic apparatus; and
  performing an exposure of the substrate using the control unit based on the slip characteristic of the patterning device.

* * * * *